United States Patent [19]
Ludlam

[11] Patent Number: 5,371,882
[45] Date of Patent: Dec. 6, 1994

[54] SPARE DISK DRIVE REPLACEMENT SCHEDULING SYSTEM FOR A DISK DRIVE ARRAY DATA STORAGE SUBSYSTEM

[75] Inventor: Henry S. Ludlam, Longmont, Colo.
[73] Assignee: Storage Technology Corporation, Louisville, Colo.
[21] Appl. No.: 820,274
[22] Filed: Jan. 14, 1992
[51] Int. Cl.$^5$ .............................................. G06F 11/00
[52] U.S. Cl. ........................................ 395/575; 371/8.1
[58] Field of Search ................... 371/10.1, 8.1, 8.2, 371/61, 9.1, 29.1; 365/200; 395/575

[56] References Cited

U.S. PATENT DOCUMENTS 4,989,206 1/1991 Dunphy, Jr. et al. .............. 371/10.1

Primary Examiner—Robert W. Beausoliel, Jr.
Assistant Examiner—Phung Chung
Attorney, Agent, or Firm—Duft, Graziano & Forest

[57] ABSTRACT

A disk drive array data storage subsystem maps between virtual and physical data storage devices and schedules the writing of data to these devices. The data storage subsystem functions as a conventional large form factor disk drive memory, using a plurality of redundancy groups, each containing n+m disk drives. The use of a pool of r shared spare disk drives in this system is enhanced by apparatus which predicts the exhaustion of the pool of spare disk drives and automatically reorders additional disk drives to replace failed disk drives in the data storage subsystem. The spare disk drive replacement scheduling system records disk drive failure data and extrapolates past failure events to a target date at which the pool of spare disk drives will be exhausted. This exhaustion date is then modified by a reorder and restocking time interval indicative of the time it takes for a repairperson to be dispatched to replace the failed disk drives and replenish the pool of shared spare disk drives. This calculated order date is then used to initiate a preventative maintenance visit by the repairperson to replace the failed disk drives before the pool of spare disk drives is exhausted.

24 Claims, 7 Drawing Sheets

5,371,882

SPARE DISK DRIVE REPLACEMENT SCHEDULING SYSTEM FOR A DISK DRIVE ARRAY DATA STORAGE SUBSYSTEM

FIELD OF THE INVENTION

This invention relates to an inexpensive, high performance, high reliability disk drive array data storage subsystem that includes an efficient data storage management system to dynamically map virtual data storage devices to logical data storage devices and schedule the writing of data on these devices. Included in this system is apparatus for automatically predicting the date that the system will exhaust a pool of spare disk drives and for automatically reordering replacement spare disk drives in response to the predicted exhaustion date.

PROBLEM

It is a problem in the field of computer systems to provide inexpensive, high performance, high reliability memory that can efficiently process changes to the data stored therein. An alternative to large form factor disk drives is the disk drive array which uses a plurality of relatively small form factor, synchronously operating disk subsystems to function as a virtual disk drive consisting of a large form factor, high capacity disk drive having an unusually high fault tolerance and a very high data transfer bandwidth. The disk drive array dynamically configures a large plurality of these small form factor disk drives into a plurality of variable size redundancy groups of n+m parallel connected disk drives to store data thereon. Each redundancy group, also called a logical disk drive, is divided into a number of logical cylinders, each containing i logical tracks, one logical track for each of the i physical tracks contained in a cylinder of one physical disk drive. Each logical track is comprised of n+m physical tracks, one physical track from each disk drive in the redundancy group. The n+m disk drives are used to store n data segments, one on each of n physical tracks per logical track, and to store m redundancy segments, one on each of m physical tracks per logical track in the redundancy group. The n+m disk drives in a redundancy group have unsynchronized spindles and loosely coupled actuators. The data segments and redundancy segments are transferred to the disk drives in a redundancy group via independent reads and writes since all disk drives operate independently. In addition, a pool of r globally switchable spare disk drives is maintained in the data storage subsystem to automatically substitute a spare disk drive for a disk drive in any redundancy group that fails during operation.

A practical difficulty with the pool of spare disk drives is that the number of spare disk drives should be maximized for reliability purposes and, at the same time, minimized to reduce the cost of the data storage subsystem. These conflicting constraints are compounded by the fact that each disk drive in the disk drive array is independent of the other disk drives for failure prediction. Therefore, it is difficult to schedule preventative maintenance on the data storage subsystem to replace failed disk drives in a cost efficient manner.

SOLUTION

The above described problems are solved and a technical advance achieved in the field by the spare disk drive replacement scheduling system for a disk drive array data storage subsystem, which uses a large plurality of small form factor disk drives configured into a plurality of variable size redundancy groups of n+m parallel connected disk drives to store data thereon. Each physical disk drive is designed so that it can detect certain failures in its operation, which allows the m redundancy segments per logical track to be used for multi-bit error correction. Identification of the failed physical disk drive provides information on the bit position of the errors in the logical track and the redundancy data provides information to correct the errors. Once a failed disk drive in a redundancy group is identified, a disk drive from a shared pool of r spare disk drives is automatically and logically switched in place of the failed disk drive. Control circuitry reconstructs the data stored on each physical track of the failed disk drive, using the remaining n−1 physical tracks of data plus the associated m physical tracks containing redundancy segments from the associated logical track. The reconstructed data is then written onto the spare disk drive that was substituted for the identified failed disk drive. The use of spare disk drives increases the system reliability of the n+m disk drive redundancy group architecture, while the use of a shared pool of spare disk drives minimizes the cost of providing the improved reliability.

The use of the shared pool of spare disk drives is enhanced by apparatus which predicts the exhaustion of the pool of spare disk drives and automatically reorders additional disk drives to proactively replace failed disk drives in the data storage subsystem. The spare disk drive replacement scheduling system records disk drive failure data each time a disk drive fails in the data storage subsystem and extrapolates past failure events to a target date at which the pool of spare disk drives will be exhausted. This exhaustion date is then modified by a reorder and restocking time interval indicative of the time it takes for a repairperson to be dispatched to replace the failed disk drives and replenish the shared pool of spare disk drives. This calculated order date is then used by the data storage subsystem to automatically initiate a preventative maintenance visit by the repairperson to replace the failed disk drives before the pool of spare disk drives is exhausted.

DETAILED DESCRIPTION OF THE DRAWING

Figure 1:
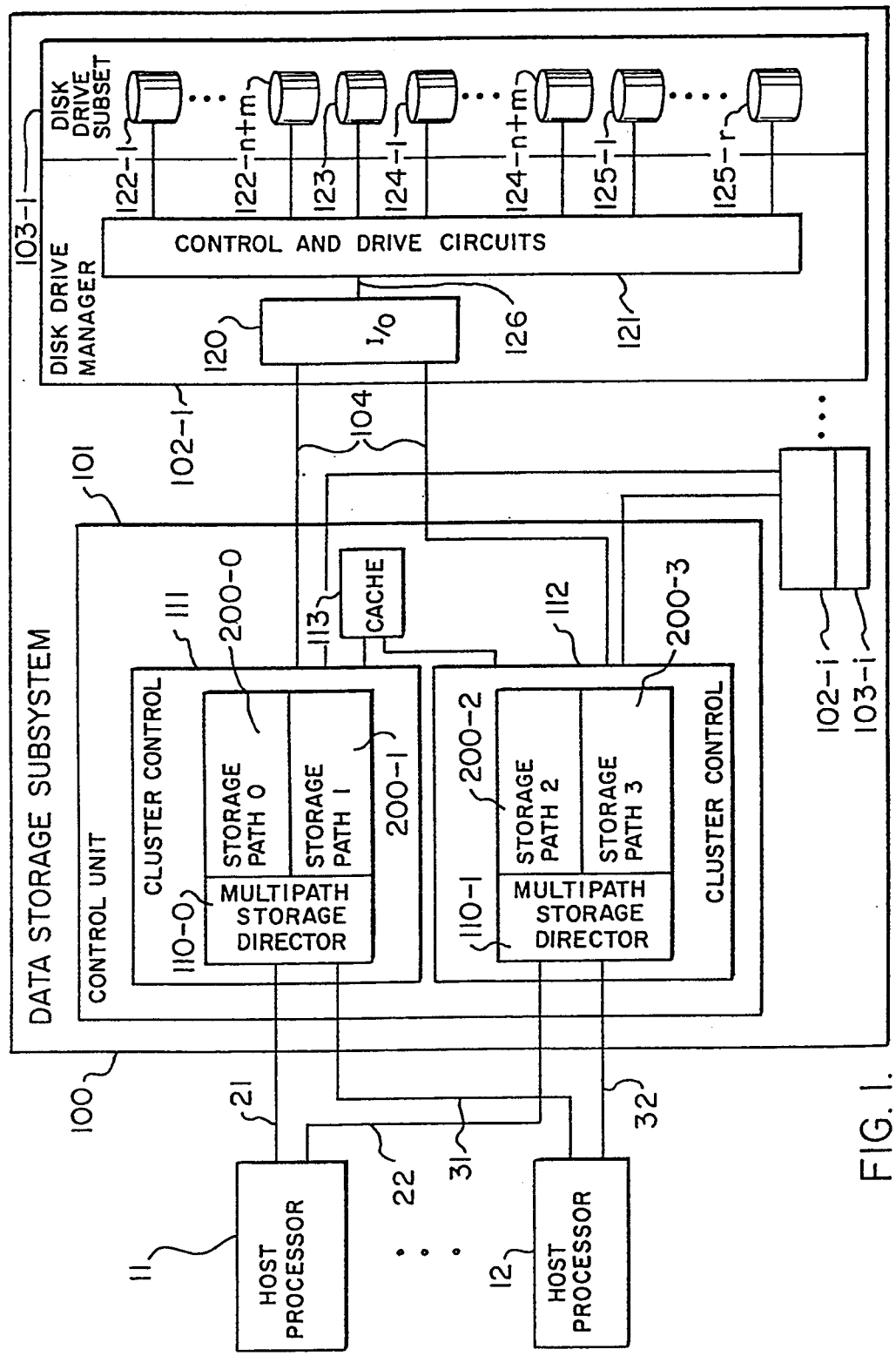
FIG. 1 illustrates in block diagram form the architecture of the disk drive array data storage subsystem.

The data storage subsystem of the present invention uses a plurality of small form factor disk drives in place of a single large form factor disk drive to implement an inexpensive, high performance, high reliability disk drive memory that emulates the format and capability of large form factor disk drives. The plurality of disk drives in the disk drive array data storage subsystem are configured into a plurality of variable size redundancy groups, each consisting of n+m parallel connected disk drives to store data thereon. Each redundancy group, also called a logical disk drive, is divided into a number of logical cylinders, each containing i logical tracks, one logical track for each of the i physical tracks contained in a cylinder of one physical disk drive. Each logical track is comprised of n+m physical tracks, one physical track from each of the n+m disk drives in the redundancy group. The n+m disk drives in a redundancy group are used to store n data segments, one on each of n physical tracks per logical track, and to store m redundancy segments, one on each of m physical tracks per logical track in the redundancy group. The n+m disk drives in a redundancy group have unsynchronized spindles and loosely coupled actuators. The data segments and redundancy segments are transferred to the disk drives of a redundancy group via independent reads and writes since all disk drives operate independently. Furthermore, the m redundancy segments, for successive logical cylinders, are distributed across all the disk drives in the redundancy group rather than using dedicated redundancy disk drives. The redundancy segments are distributed so that every actuator in a redundancy group is used to access some of the data segments stored on the disk drives. In addition, a pool of r globally switchable spare disk drives is maintained in the data storage subsystem to automatically substitute a spare disk drive for a disk drive in any redundancy group that fails during operation. The shared pool of r spare disk drives provides high reliability at low cost.

Each physical disk drive is designed so that failures in its operation can be detected, which allows the m redundancy segments per logical track to be used for multi-bit error correction. Identification of the failed physical disk drive provides information on the bit position of the errors in the logical track and the redundancy data provides information to correct the errors. Once a failed disk drive in a redundancy group is identified, a spare disk drive from the shared pool of spare disk drives is automatically and logically switched in place of the failed disk drive. Control circuitry reconstructs the data stored on each physical track of the failed disk drive, using the remaining n−1 physical tracks of data plus the associated m physical tracks containing redundancy segments from the associated logical track. The reconstructed data is then written onto the spare disk drive that was substituted for the identified failed disk drive. The use of spare disk drives increases the system reliability of the n+m disk drive redundancy group architecture while the use of a shared pool of r spare disk drives minimizes the cost of providing the improved reliability.

Data Storage Subsystem Architecture

FIG. 1 illustrates in block diagram form the architecture of the preferred embodiment of the disk drive array data storage subsystem 100. The disk drive array data storage subsystem 100 appears to the associated host processors 11–12 to be a collection of large form factor disk drives with their associated storage control, since the architecture of disk drive array data storage subsystem 100 is transparent to the associated host processors 11–12. This disk drive array data storage subsystem 100 includes a plurality of disk drives (for example—122-1 to 125-r) located in a plurality of disk drive subsets 103-1 to 103-i. The disk drives 122-1 to 125-r are significantly less expensive, even while providing disk drives to store redundancy information and providing spare disk drives, than the typical 14 inch form factor disk drive with an associated backup disk drive. The plurality of disk drives 122-1 to 125-r are typically the commodity hard disk drives in the 5¼ inch form factor.

The architecture illustrated in FIG. 1 is that of a plurality of host processors 11–12 interconnected via the respective plurality of data channels 21, 22–31, 32 to a data storage subsystem 100 that provides the backend data storage capacity for host processors 11–12. This basic configuration is well known in the data processing art. The data storage subsystem 100 includes a control unit 101 that serves to interconnect the subsets of disk drives 103-1 to 103-i and their associated drive managers 102-1 to 102-i with data channels 21–22, 31–32 that interconnect data storage subsystem 100 with the plurality of host processors 11, 12.

Control unit 101 typically includes two cluster controls 111, 112 for redundancy purposes. Within a cluster control 111, multipath storage director 110-0 provides a hardware interface to interconnect data channels 21, 31 to cluster control 111 contained in control unit 101. In this respect, the multipath storage director 110-0 provides a hardware interface to the associated data channels 21, 31 and provides a multiplex function to enable any attached data channel (for example—21) from any host processor (for example—11) to interconnect to a selected cluster control 111 within control unit 101. The cluster control 111 itself provides a pair of storage paths 200-0, 200-1 which function as an interface to a plurality of optical fiber backend channels 104. In addition, cluster control 111 includes a data compression function as well as a data routing function that enables cluster control 111 to direct the transfer of data between a selected data channel 21 and cache memory 113, and between cache memory 113 and one of the connected optical fiber backend channels 104. Control unit 101 provides the major data storage subsystem control functions that include the creation and regulation of data redundancy groups, reconstruction of data for a failed disk drive, switching a spare disk drive in place of a failed disk drive, data redundancy generation, logical device space management, and virtual to logical device mapping.

Disk drive manager 102-1 interconnects a plurality of commodity disk drives 122-1 to 125-r included in disk drive subset 103-1 with a plurality of optical fiber backend channels 104. Disk drive manager 102-1 includes an input/output circuit 120 that provides a hardware interface to interconnect optical fiber backend channels 104 with data paths 126 that serve control and drive circuits 121. Control and drive circuits 121 receive data on conductors 126 from input/output circuit 120 and convert the form and format of these signals as required by the associated commodity disk drives 122-1 to 125-r in disk drive subset 103-1. In addition, control and drive circuits 121 provide a control signalling interface to transfer signals between disk drive subset 103-1 and control unit 101.

The data that is written onto the disk drives 122-1 to 125-r in disk drive subset 103-1 consists of data that is transmitted from an associated host processor 11 over data channel 21 to one of cluster controls 111, 112 in control unit 101. The transmitted data is Written by cluster control 111 into cache memory 113. Cluster control 111 stores n segments of data in cache memory 113 and generates m redundancy segments for error correction purposes. Cluster control 111 then selects a subset of disk drives (for example 122-1 to 122-n+m) to form a redundancy group to store the received data segments and generated redundancy segments. Cluster control 111 selects an empty logical track, consisting of n+m physical tracks, in the selected redundancy group (122-1 to 122-n+m). Each of the n physical tracks of the data are written onto one of n disk drives in the selected data redundancy group (122-1 to 122-n+m). An additional m disk drives are used in the selected redundancy group (122-1 to 122-n+m) to store the m redundancy segments. The m redundancy segments include error correction characters and data that can be used to verify the integrity of the n physical tracks that are stored on the n disk drives as well as to reconstruct one or more of the n physical tracks of the data if that physical track were lost due to a failure of the disk drive on which that physical track is stored.

Thus, data storage subsystem 100 can emulate one or more large form factor disk drives (for example—an IBM 3380K type of disk drive) using a plurality of smaller form factor disk drives while providing a high reliability capability by writing the data across a plurality of the smaller form factor disk drives. A reliability improvement is also obtained by providing a pool of r spare disk drives (125-1 to 125-r) that are logically switchably interconnectable in place of a failed disk drive. Data reconstruction is accomplished by the use of the m redundancy segments, so that the data stored on the n−1 remaining functioning disk drives combined with the redundancy information stored in the m redundancy segments can be used by control software in control unit 101 to reconstruct the data lost when one or more of the plurality of disk drives in the redundancy group (122-1 to 122-n+m) fails. This arrangement provides a reliability capability similar to that obtained by disk shadowing arrangements at a significantly reduced cost over such an arrangement.

Disk Drive

Each of the disk drives 122-1 to 125-r in disk drive subset 103-1 can be considered a disk subsystem that consists of a disk drive mechanism and its surrounding control and interface circuitry. The disk drive mechanism consists of a commodity disk drive which is a commercially available hard disk drive of the type that typically is used in personal computers. A control processor associated with the disk drive mechanism has control responsibility for the entire disk drive and monitors all information routed over the various serial data channels that connect each disk drive 122-1 to 125-r to control and drive circuits 121. Any data transmitted to a disk drive over these channels is stored in a corresponding interface buffer which is connected via an associated serial data channel to a corresponding serial/parallel converter circuit. A disk controller is also provided in each disk drive to implement the low level electrical interface required by the commodity disk drive. The commodity disk drive has an ESDI interface which must be interfaced with control and drive circuits 121. The disk controller provides this function. Disk controller provides serialization and deserialization of data, CRC/ECC generation, checking and correction and NRZ data encoding. The addressing information such as the head select and other type of control signals are provided by control and drive circuits 121 to commodity disk drive 122-1. This communication path is also provided for diagnostic and control purposes.

For example, control and drive circuits 121 can power a commodity disk drive down when the disk drive is in the standby mode. In this fashion, commodity disk drive remains in an idle state until it is selected by control and drive circuits 121.

Control Unit

Figure 2:
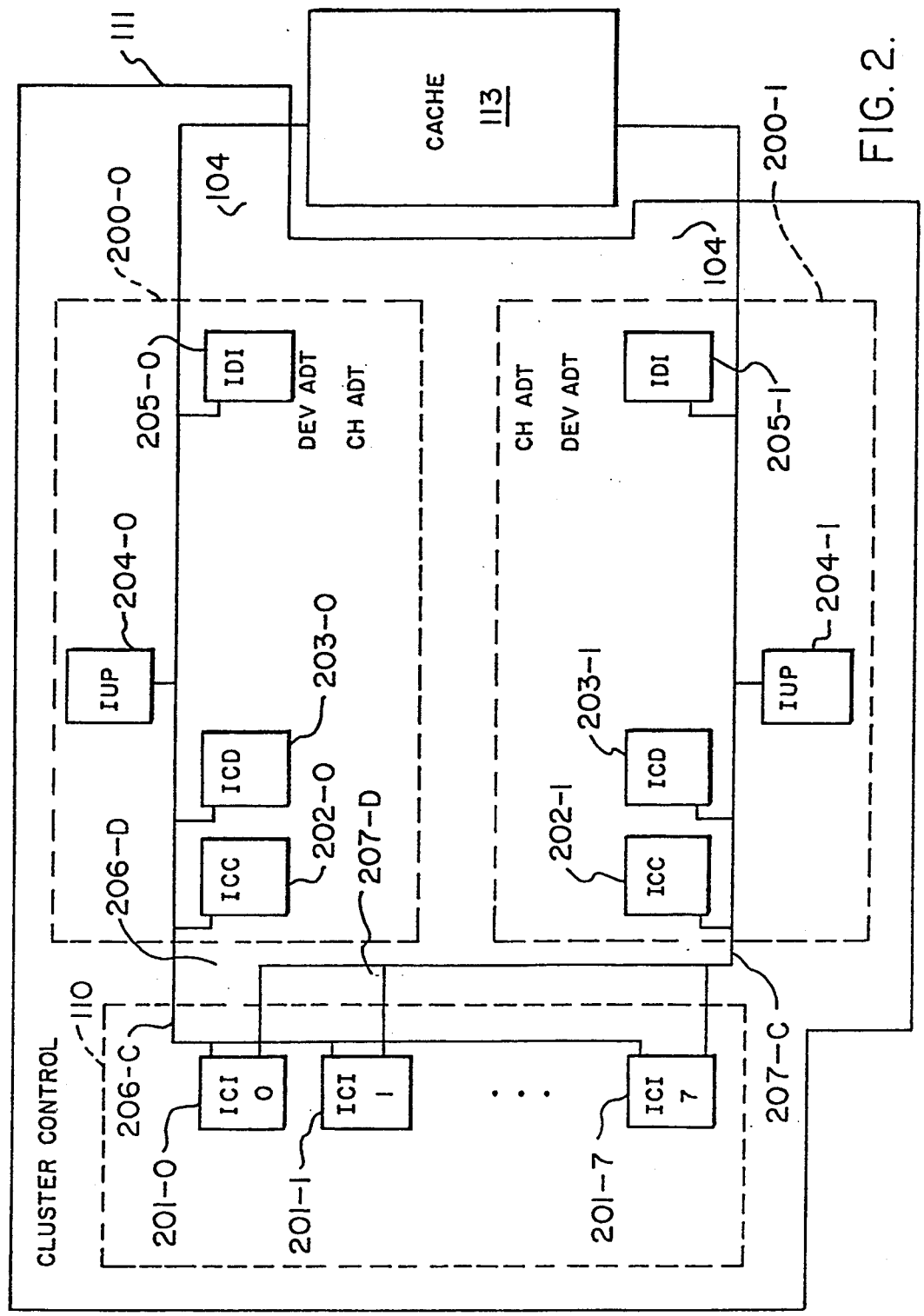
FIG. 2 illustrates the cluster control of the data storage subsystem.

FIG. 2 illustrates in block diagram form additional details of cluster control 111. Multipath storage director 110 includes a plurality of channel interface units 201-0 to 201-7, each of which terminates a corresponding pair of data channels 21, 31. The control and data signals received by the corresponding channel interface unit 201-0 are output on either of the corresponding control and data buses 206-C, 206-D, or 207-C, 207-D, respectively, to either storage path 200-0 or storage path 200-1. Thus, as can be seen from the structure of cluster control 111 illustrated in FIG. 2, there is a significant amount of symmetry contained therein. Storage path 200-0 is identical to storage path 200-1 and therefore only one of these is described herein. The multipath storage director 110 uses two sets of data and control busses 206-D, C and 207-D, C to interconnect each channel interface unit 201-0 to 201-7 with both storage path 200-0 and 200-1 so that the corresponding data channel 21 from the associated host processor 11 can be switched via either storage path 200-0 or 200-1 to the plurality of optical fiber backend channels 104. Within storage path 200-0 is contained a processor 204-0 that regulates the operation of storage path 200-0. In addition, an optical device interface 205-0 is provided to convert between the optical fiber signalling format of optical fiber backend channels 104 and the metallic conductors contained within storage path 200-0. Channel interface control 202-0 operates under control of processor 204-0 to control the flow of data to and from cache memory 113 and one of the channel interface units 201 that is presently active with storage path 200-0. The channel interface control 202-0 includes a cyclic redundancy check (CRC) generator/checker to generate and check the CRC bytes for the received data. The channel interface circuit 202-0 also includes a buffer that compensates for speed mismatch between the data transmission rate of the data channel 21 and the available data transfer capability of cache memory 113. The data that is received by the channel interface control circuit 202-0 from a corresponding channel interface circuit 201 is forwarded to cache memory 113 via channel data compression circuit 203-0. The channel data compression circuit 203-0 provides the necessary hardware and microcode to perform compression of the channel data for control unit 101 on a data write from host processor 11. It also performs the necessary decompression operation for control unit 101 on a data read operation by host processor 11.

As can be seen from the architecture illustrated in FIG. 2, all data transfers between a host processor 11 and one of the plurality of redundancy groups (122-1 to 122-n+m, 124-1 to 124-n+m) in the disk drive subsets 103 are routed through cache memory 113. Control of cache memory 113 is provided in control unit 101 by processor 204-0. The functions provided by processor 204-0 include initialization of the cache directory and other cache data structures, cache directory searching and management, cache space management, cache performance improvement algorithms as well as other cache control functions. In addition, processor 204-0 creates the redundancy groups (122-1 to 122-n+m, 124-1 to 124-n+m) from the disk drives in disk drive subsets 103 and maintains records of the status of those devices. Processor 204-0 also causes the redundancy data across the n data disks in a redundancy group to be generated within cache memory 113 and writes the m segments of redundancy data onto the m redundancy disks in the redundancy group. The functional software in processor 204-0 also manages the mappings from virtual to logical and from logical to physical devices. The tables that describe this mapping are updated, maintained, backed up and occasionally recovered by this functional software on processor 204-0. The free space collection function is also directed by processor 204-0 as well as management and scheduling of the optical fiber backend channels 104. Many of these above functions are well known in the data processing art and are not described in any detail herein.

Disk Drive Manager

Figure 3:
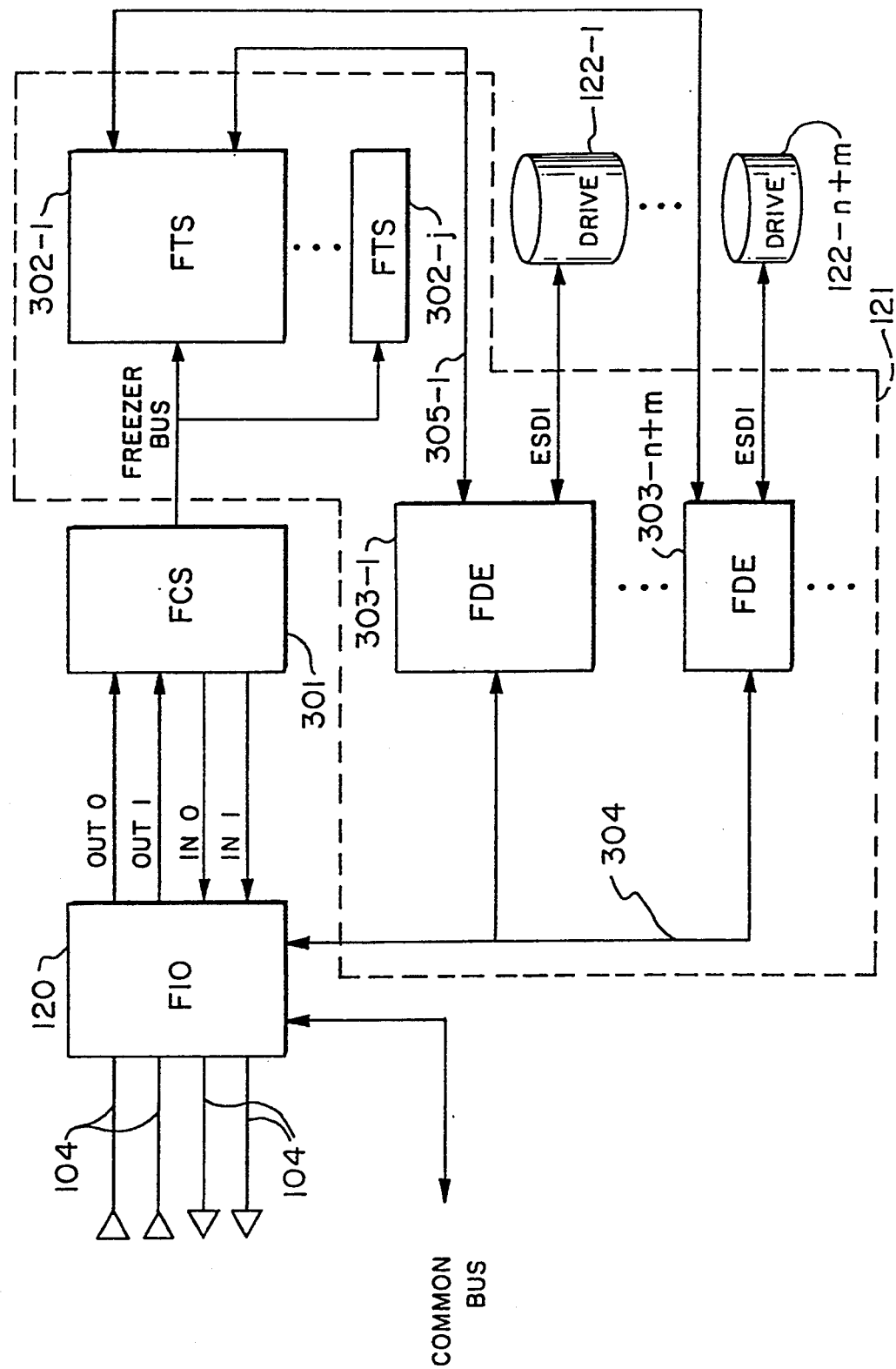
FIG. 3 illustrates the disk drive manager.

FIG. 3 illustrates further block diagram detail of disk drive manager 102-1. Input/output circuit 120 is shown connecting the plurality of optical fiber channels 104 with a number of data and control busses that interconnect input/output circuit 120 with control and drive circuits 121. Control and drive circuits 121 consist of a command and status circuit 301 that monitors and controls the status and command interfaces to control unit 101. Command and status circuit 301 also collects data from the remaining circuits in disk drive managers 102 and the various disk drives in disk drive subsets 103 for transmission to control unit 101. Control and drive circuits 121 also include a plurality of drive electronics circuits 303, one for each of the commodity disk drives that is used in disk drive subset 103-1. The drive electronics circuits 303 control the data transfer to and from the associated commodity drive via an ESDI interface. The drive electronics circuit 303 is capable of transmitting and receiving frames on the serial interface and contains a microcontroller, track buffer, status and control registers and industry standard commodity drive interface. The drive electronics circuit 303 receives data from input/output circuit 120 via an associated data bus 304 and control signals via control leads 305. Control and drive circuits 121 also include a plurality of subsystem circuits 302-1 to 302-j, each of which controls a plurality of drive electronics circuits 303. The subsystem circuit 302 controls the request, error and spin up lines for each drive electronics circuit 303. Typically, a subsystem circuit 302 interfaces with thirty-two drive electronics circuits 303. The subsystem circuit 302 also functions to collect environmental sense information for transmission to control unit 101 via command and status circuit 301. Thus, control and drive circuits 121 in disk drive manager 102-1 perform the data and control signal interface and transmission function between the commodity disk drives of disk drive subset 103-1 and control unit 101.

Command and Status Circuit

Figure 4:
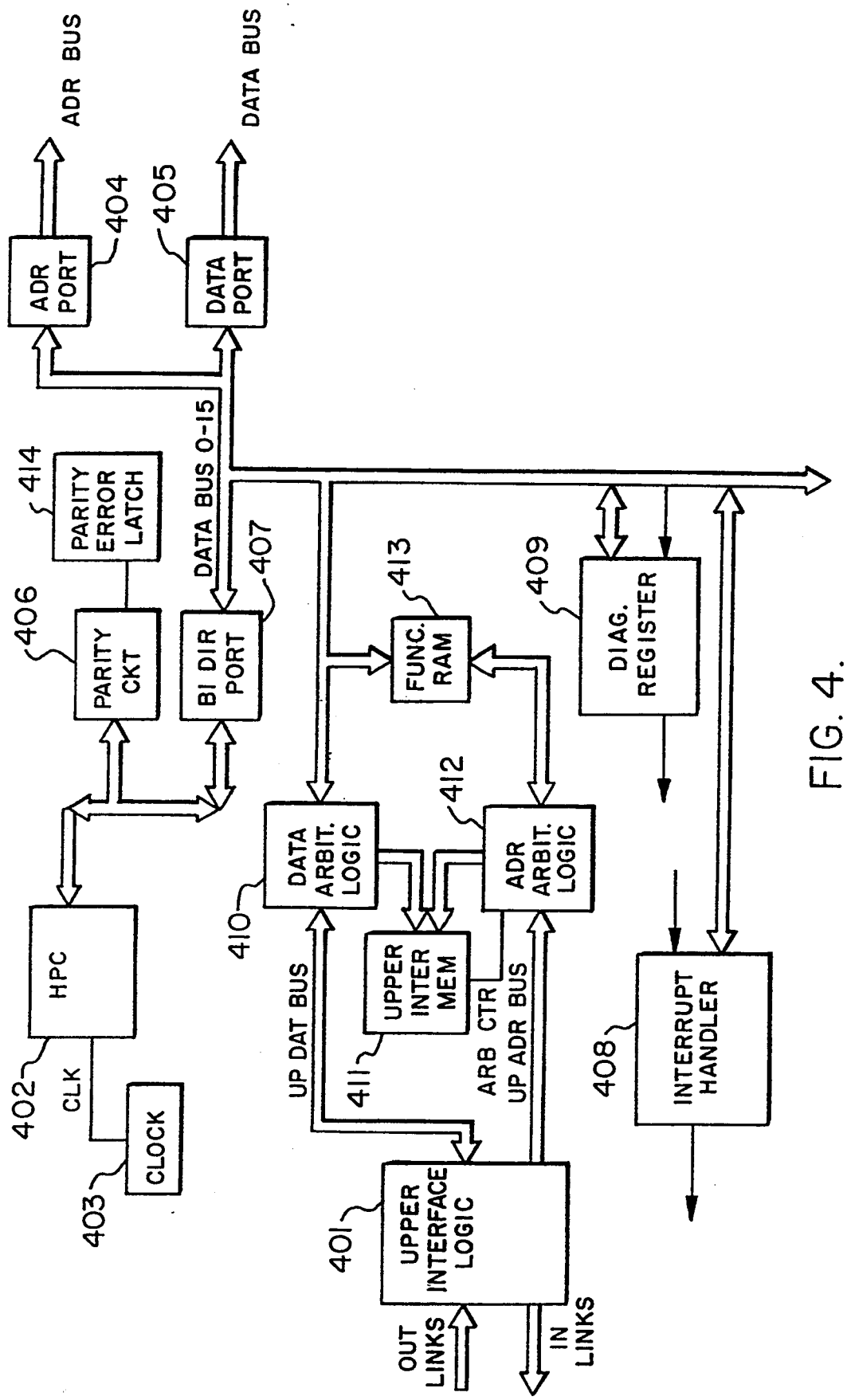
FIG. 4 illustrates the disk drive manager control circuit.

The command and status circuit 301 is illustrated in further detail in FIG. 4. The circuit has three main functions: collect status from the various subsystem circuits 302, report status to control unit 101 and provide diagnostics for disk drive manager 102-1. Command and status circuit 301 is controlled by a processor 402 and its associated clock 403. Processor 402 communicates with the address (ADR) and data (DATA) busses via ports 404 and 405 respectively. The direction of communication between processor 402 and the busses (ADR, DATA) and the remaining circuits in command and status circuit 301 is controlled by bidirectional port 407 which acts as an arbiter to regulate access to internal bus of command and status circuit 301. Similarly, data and address arbitration logic circuits 410 and 412 regulate the access of interface circuit 401 to the internal data bus of command and status circuit 301. For example, data received from input/output circuit 120 is received by interface circuit 401 which stores this data in memory 411 via address and data busses that are connected between interface circuit 401 and data and address arbitration logic 410 and 412. These arbitration circuits regulate access to memory 411 from the internal data bus of command and status circuit 301 and interface circuit 401. Similarly, processor 402 can access the data stored in memory 411 via the internal data bus of command and status circuit 301 and the corresponding data and address arbitration logic 410, 412. This data retrieved by processor 402 can then be output via address and data busses to the subsystem circuits 302 via address and data ports 404, 405 respectively.

Command and status circuit 301 includes interrupt handler 408. All interrupts in disk drive manager 102-1, except for reset, are brought through interrupt handler 408. Interrupt handler 408 collects all interrupts of a particular class which interrupts are read by interrupt software in processor 402. The interrupt software reads the memory mapped space in interrupt handler 408 to determine the bit pattern which indicates what interrupt has occurred.

Drive Electronics Circuit

Figure 5:
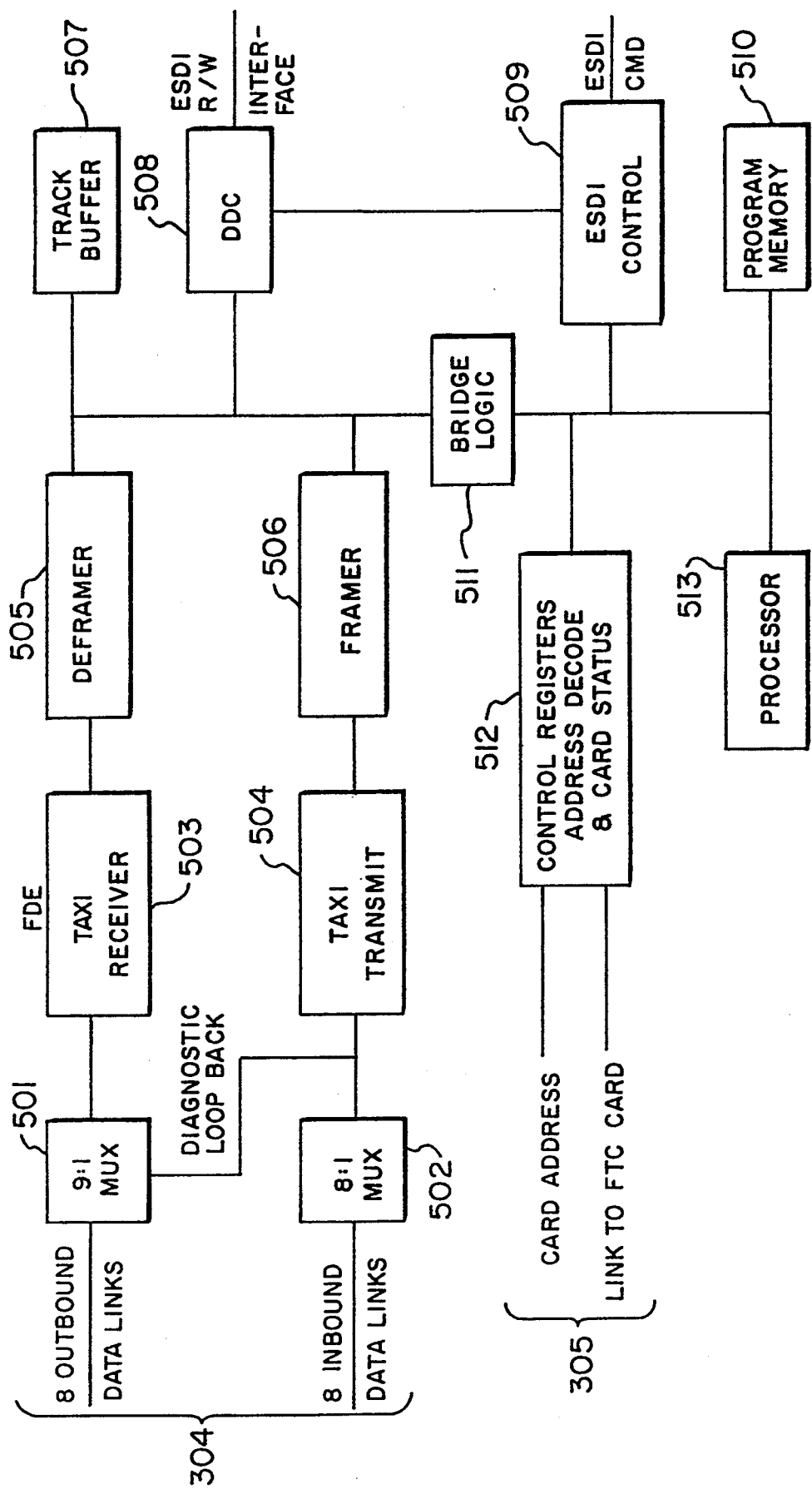
FIG. 5 illustrates the disk drive manager disk control electronics.

The drive electronics circuit 303 functions as an interface between the serial data links 304 that interconnect the input/output circuit 120 and the industry standard commodity disk drive such as drive 122-1. FIG. 5 illustrates additional details of drive electronics circuit 303. The serial data links 304 consist of eight outbound data links and eight inbound data links that are coupled via multiplexers 501 and 502 respectively to the internal circuitry of drive electronics circuit 303. Receiver 503 monitors the outbound data links and converts the information received from input/output circuit 120 into a parallel format for use by deframer circuit 505. Deframer circuit 505 checks if the destination address field in the received frame correlates with the drive electronics circuit's preprogrammed selection address. If the addresses are the same, deframer circuit 505 determines if the information being transmitted is data or a command, then stores the information in track buffer 507 using one of two DMA pointers, one for data storage and the other for command storage. Track buffer circuit 507 is capable of storing one complete physical track of information for transmission to the associated commodity disk drive 122-1. Deframer circuit 505 generates an interrupt when the transfer of a physical track of information is completed. The interrupt generated by deframer 505 is transmitted to processor 513, which interprets the command or data stored in track buffer 507 and acts accordingly. If processor 513 determines that the command is a data transfer command it initializes the control registers 512 for the data transfer. Processor 513 also activates ESDI control circuit 509 which provides the physical interface between the associated commodity disk drive 122-1 and the internal circuit of drive electronics circuit 303-1. Processor 513 also activates disk data controller circuit 508 which functions to interface commodity disk drives with microprocessor controlled systems. The disk data controller 508 is responsible for the data transfer from track buffer 507 to the ESDI control circuit 509. Therefore, the data path is from track buffer 507 through disk data controller 508 and ESDI control circuit 509 to the commodity disk drive 122-1. The ESDI control circuit 509 simply provides the electrical interface between drive electronics circuit 303-1 and disk drive 122-1.

Data transfers from disk drive 122-1 to input/output circuit 120 are accomplished in similar fashion. The data is read by processor 513 in response to a request for a data read from control unit 101 by addressing the data on disk drive 122-1 via ESDI control circuit 509. The data read from disk drive 122-1 is routed through ESDI control circuit 509 and disk data controller 508 to track buffer 507 where it is stored until a complete physical track or a meaningful part thereof is stored therein. Framer 506 retrieves the physical track from track buffer 507 and formats and frames this physical track and forwards it to transmitter circuit 504. Transmitter circuit 504 transmits the frames serially through one of the eight inbound data links via multiplexer 502 to input/output circuit 120.

Disk Drive Malfunction

Control unit 101 determines whether an individual disk drive (for example 122-1) in a redundancy group (122-1 to 122-n+m) addressed by control unit 101 has malfunctioned. A control unit 101 that has detected a failed disk drive 122-1 transmits a control message to disk drive manager 102-1 over the corresponding control signal lead to indicate that a disk drive 122-1 in disk drive subset 103-1 has failed. Control unit 101 takes failed disk drive 122-1 out of service and a spare disk drive 125-1 is selected from the pool of r spare disk drives (125-1 to 125-r) by disk drive manager 102-1, at the request of control unit 101. This is accomplished by rewriting the configuration definition of the redundancy group (122-1 to 122n+m) that contained failed disk drive 122-1. The selected spare disk drive-125-1 is connected in place of failed disk drive 122-1 in the redundancy group (122-1 to 122-n+m) and is identified by control signals which are transmitted to all of cluster controls 111–112. This ensures that the system mapping information stored in each of cluster controls 111–112 is kept up to date.

Once the selected spare disk drive (125-1) is added to the redundancy group (122-1 to 122-n+m), it is tested and, if found to be operating properly, replaces the failed disk drive 122-1 in the system mapping tables. The control unit 101 that requested the spare disk drive (125-1) reconstructs the data stored on failed disk drive 122-1 for the selected spare disk drive (125-1) using the remaining n−1 operational data disk drives and the available redundancy information from the m redundancy disk drives in the redundancy group. Before data reconstruction is complete on the selected spare disk drive (125-1), data is still available to host processors 11, 12, although it must be reconstructed from the n−1 surviving data and m redundancy disk drives rather than just reading it from a single disk drive. When this data reconstruction operation is complete, the reconstructed data segments are written on the selected spare disk drive (125-1) that replaced failed disk drive 122-1 and the redundancy group is again fully operational.

Spare Drive Management

As noted above, data storage subsystem 100 includes a shared pool of r spare disk drives 125-1 to 125-r which are logically switchably interconnectable in place of any of the failed disk drives that are used to create redundancy groups (122-1 to 122-n+m, 124-1 to 124-n+m) for storage of data thereon. Disk drive manager 102 performs the function of monitoring the operation of the various disk drives in the disk drive array, while processor 204 in control unit 101 controls their activation. Control unit 101 records data concerning the failures of disk drives contained within the associated disk drive array and also calculates when the pool of spare disk drives (125-1 to 125-r) will most likely be exhausted by the future failure of additional disk drives.

The failure prediction is important because, as noted above, when a disk drive fails within a redundancy group, the data remaining on the additional n−1 disk drives in the redundancy group and redundancy data stored on the m redundancy drives are used to reconstruct the data on the failed disk drive. The reconstructed data is then written to a spare disk drive selected from the pool of spare disk drives. When the pool of spare disk drives is exhausted, the data reconstruction activity is reduced to track reconstruction, wherein the data is reconstructed on a track by track basis as the tracks are requested by the host processor. The track reconstruction is initiated since there is insufficient spare memory capacity in the data storage subsystem 100 to store an entire reconstructed disk drive if the pool of spare disk drives is exhausted. Having to reconstruct data on a track by track basis significantly impacts the data throughput capacity of data storage subsystem 100. It is therefore desirable to replace failed disk drives before the pool of spare disk drives is exhausted. However, it is also desirable to minimize the number of service calls to replace disk drives in data storage subsystem 100. The optimum situation is therefore to replace the maximum number of failed disk drives in one service call, such as when all of the pool of spare drives have been used to replace failed drives and yet there are no additional disk drive failures within any redundancy group to impact data availability. However, the dispatch of a repairperson on a service call consumes a finite period of time and the dispatch of the repairperson when the final drive in the pool of spare disk drives is assigned to replace a failed disk drive places the performance of data storage subsystem 100 at risk since an additional disk drive could fail before the repairperson can effectuate the repairs. Therefore, it is advantageous to predict the time at which the last disk drive in the pool of spare disk drives is most likely to be assigned to replace a failed disk drive and schedule the repairperson service call at or before this predicted time.

Figure 6:
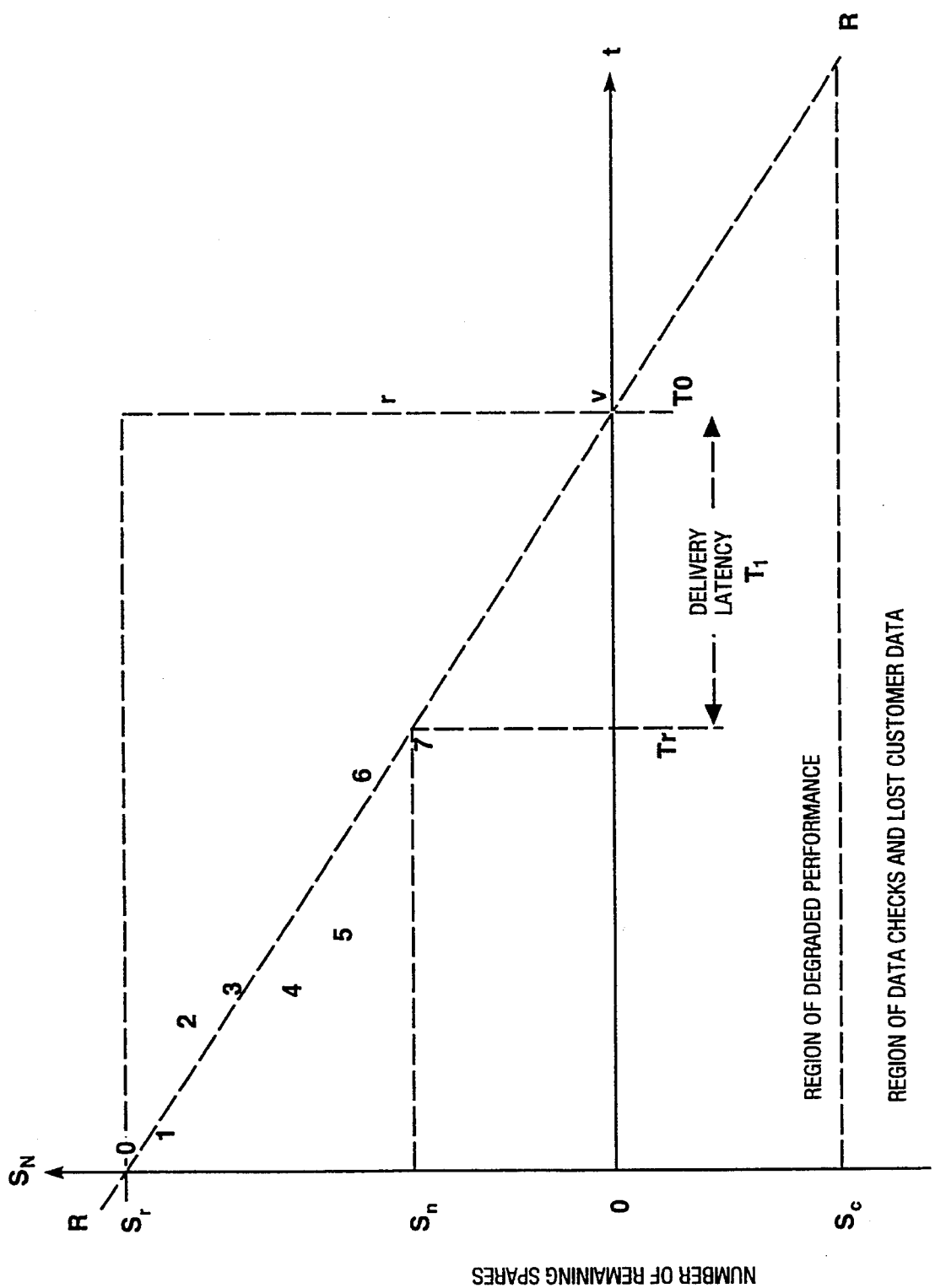
FIG. 6 illustrates in graphical form the operation of the spare disk drive exhaustion prediction apparatus.

This is accomplished in data storage subsystem 100 by recording the real time at which a disk drive is determined to have failed. The accumulated data regarding all disk drive failures is then used to compute a failure pattern which is used to predict a time when the last of the spare disk drives will be used to replace a failed disk drive. This is illustrated graphically in FIG. 6 wherein the vertical axis represents the number of spare disk drives $S_N$ in data storage subsystem 100 and the horizontal axis indicates time t. As can be seen from FIG. 6, failure events are plotted as they occur and a linear regression line is computed using these data points. The linear regression line is indicative of a failure pattern of the disk drives within data storage subsystem 100 and the point at which the linear regression line crosses the horizontal axis of FIG. 6 represents the time $T_0$ at which it is predicted that the number of remaining spare disk drives in data storage subsystem 100 will reach zero. Allowing for a delivery or repair latency period of $T_l$, the order point $T_r$ is then computed as being $T_0$ minus $T_l$ to indicate the time at which data storage subsystem 100 generates a request to replace the failed disk drives. While a linear regression line is disclosed herein, any prediction methodology can be used to estimate the time at which the last spare disk drive will be utilized. In addition, the set of failures used as data points can be all failures or the set of failures since the last replenishment of disk drives by a repairperson.

Spare Disk Drive Exhaustion Determination

Figure 7:
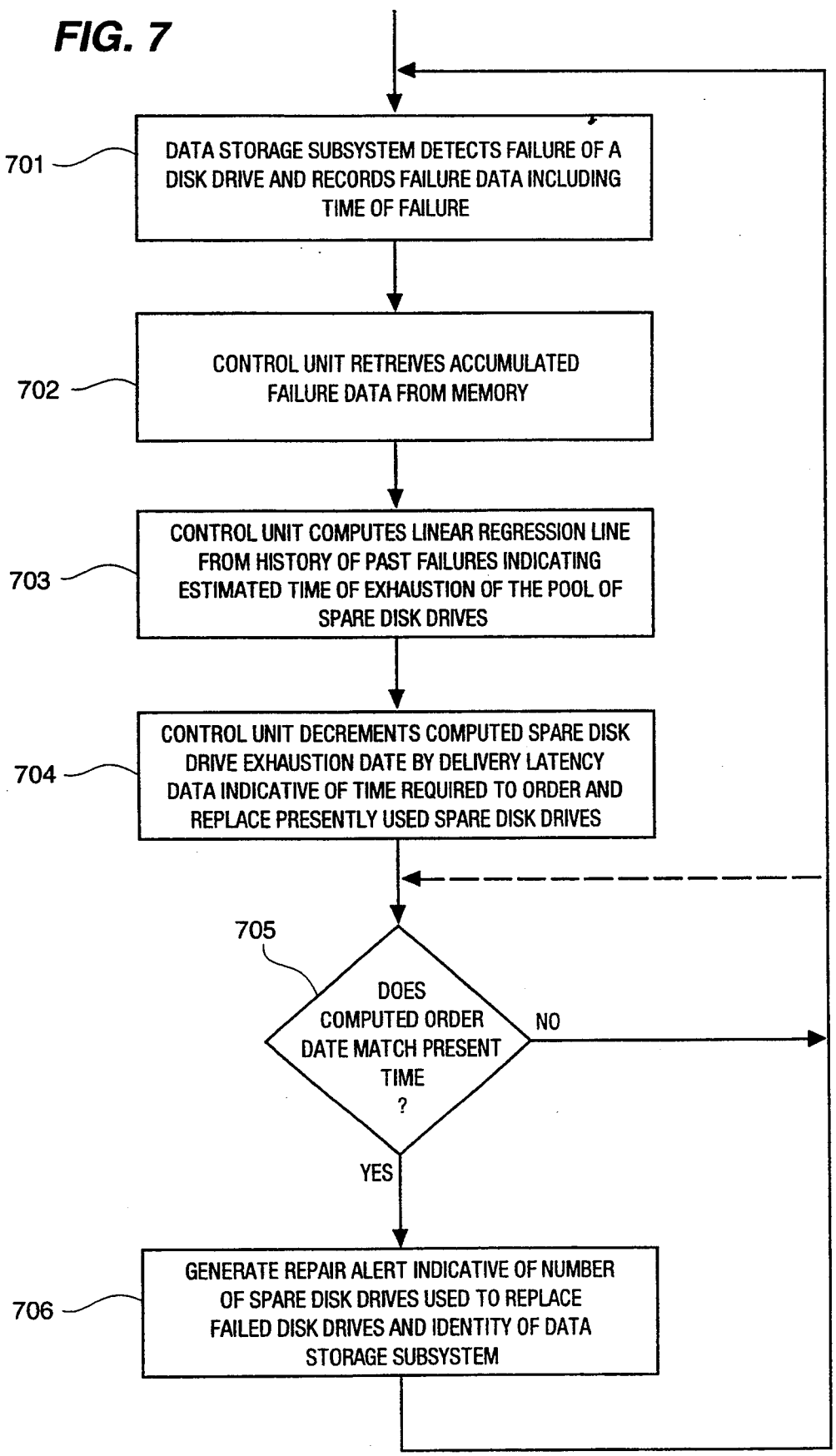
FIG. 7 illustrates in flow diagram form the operation of the spare disk drive exhaustion prediction apparatus.

FIG. 7 illustrates in flow diagram form the operational steps taken by processor 204 in control unit 101 to predict the date at which the pool of spare disk drives 125-1 to 125-r will be exhausted. At step 701, a disk drive failure occurs and processor 204 records the time of this disk drive failure and the identity of the failed disk drives in cache memory 113. At step 702, the previously collected failure data is retrieved from cache memory 113 by processor 204, which then dynamically computes at step 703 the linear regression line illustrated graphically in FIG. 6 to identify a spare disk drive exhaustion date $T_0$. These calculations are given by the following equations.

The S-intercept $S_r$ (when there is a full complement of r spare disk drives) and slope (m) for the linear regression line (R—R) shown in FIG. 6 are given by:

$$S_r = \frac{1}{r}\left(\sum_{i=1}^{r} S_i - m \sum_{i=1}^{r} T_i\right)$$

$$m = \frac{\sum_{i=1}^{r}(T_i \cdot S_i) - \frac{\sum_{i=1}^{r} T_i \cdot \sum_{i=1}^{r} S_i}{N}}{\sum_{i=1}^{r} T_i^2 - \frac{\left(\sum_{i=1}^{r} T_i\right)^2}{N}}$$

The t axis intercept of the linear regression line R—R is $T_0$, the expected time (spare disk drive exhaustion date) when the number of spare disk drives has decreased to zero. This value $T_O$ is given by:

$$T_0 = \frac{1}{r}\left(\sum_{i=1}^{r} T_i - \left(\frac{1}{m} \cdot \sum_{i=1}^{r} S_i\right)\right)$$

At step 704, processor 204 computes the expected spare disk drive reorder date by determining:

$$T_r = T_0 - T_l$$

Where $T_l$ is the delivery latency, represented by data stored in cache memory 113 indicative of the time required to order and replace a full complement of r spare disk drives.

With each set of calculations performed, a new disk drive order date is computed, stored in cache memory 113 and, at step 705, compared to a real time clock within data storage subsystem 100. If the order time does not match the real time clock, processing returns to step 701 to await another disk drive failure. The time comparison is also periodically repeated as indicated by the dotted line path illustrated in FIG. 7. When the difference between the real time clock and the disk drive reorder date reaches zero, data storage subsystem 100 initiates a repair alert at step 706 indicating that data storage subsystem 100 requires replenishment of the spare disk drives contained therein. This repair alert can be a simple control message transmitted to the associated host processor or can be a data transmission via dial up common carrier telecommunication facilities (not shown) to a repair facility. If the latter is the case, processor 204 activates a maintenance circuit (not shown) which contains a telecommunications interface with an auto dialer. The maintenance circuit, in response to control signals from processor 204, initiates a telecommunications connection to a local repair facility and transmits data once connected thereto to indicate the identity of data storage subsystem 100 and the need for the pool of r spare disk drives contained in data storage subsystem 100 to be replenished. In this manner, data storage subsystem 100 not only reconstructs data in response to a failed disk drive, but also predicts when the pool of r spare disk drives will be exhausted and reorders replacement disk drives, all without the involvement of the host processor or human intervention.

While a specific embodiment of this invention has been disclosed herein, it is expected that those skilled in the art can design other embodiments that differ from this particular embodiment but fall within the scope of the appended claims.

I claim:

1. In a disk memory system which stores data records for at least one host processor on a plurality of disk drives, a subset of said plurality of disk drives being configured into at least two redundancy groups, each redundancy group consisting of at least two disk drives, wherein said disk memory system includes means responsive to receipt of a stream of data records from said host processor for selecting available memory space in one of said at least two redundancy groups to store said received stream of data records thereon and means for writing said received stream of data records and redundancy data associated with said received stream of data records in said selected available memory space in said selected redundancy group, an automated disk drive replacement scheduling system comprising:

means for reserving at least one of said plurality of disk drives as spare disk drives, which spare disk drives are shared in common by said at least two redundancy groups;

means for identifying one of said at least two disk drives in one of said at least two redundancy groups that fails to function;

means for connecting one of said spare disk drives in place of said identified failed disk drive;

means, responsive to said identifying means, for storing failure data indicative of a time of failure of said identified failed disk drive; and means for computing from said stored failure data a spare disk drive exhaustion date that indicates when said connecting means is likely to utilize a last of said reserved spare disk drives.

2. The system of claim 1 further comprising:

means, responsive to said computing means, for transmitting data to a maintenance facility, on a replacement disk drive order date which is a predetermined time in advance of said spare disk drive exhaustion date, which data is indicative of the identity of said disk memory system and a number of said spare disk drives presently utilized by said connecting means.

3. The system of claim 2 wherein said computing means comprises:
  means for storing data indicative of a repair time interval required by a repairperson to replace failed disk drives; and
  means for determining said replacement disk drive order date by decrementing said spare disk drive exhaustion date by said repair time interval.

4. The system of claim 3 wherein said disk memory system includes a real time clock signal, said computing means further comprises: means for activating said transmitting means when said real time clock signal matches said computed replacement disk drive order date.

5. The system of claim 1 further comprising:
  means for reconstructing said stream of data records written on said identified failed disk drive, using said associated redundancy data; and
  means for writing said reconstructed stream of data records on to said one connected spare disk drive.

6. The system of claim 5 wherein said reconstructing means comprises:
  means for generating said stream of data records written on said identified failed disk drive using said associated redundancy data and data records written on all said at least two disk drives in said redundancy group except said identified failed disk drive.

7. In a disk memory system which stores data records for at least one host processor on a plurality of disk drives, a subset of said plurality of disk drives being configured into at least two redundancy groups, each redundancy group consisting of at least two disk drives, wherein said disk memory system is responsive to receipt of a stream of data records from said host processor for selecting available memory space in one of said at least two redundancy groups to store said received stream of data records thereon and for writing said received stream of data records and redundancy data associated with said received stream of data records in said selected available memory space in said selected redundancy group, a method of automatically scheduling replacement of disk drives comprising the steps of:
  reserving at least one of said plurality of disk drives as spare disk drives, which spare disk drives are shared in common by said at least two redundancy groups;
  identifying one of said disk drives in one of said at least two redundancy groups that fails to function;
  connecting one of said spare disk drives in place of said identified failed disk drive;
  storing failure data, in response to said step of identifying, indicative of a time of failure of said identified failed disk drive; and
  computing from said stored failure data a spare disk drive exhaustion date that indicates when said step of connecting is likely to utilize a last of said reserved spare disk drives.

8. The method of claim 7 further comprising the step of:
  transmitting data to a maintenance facility on a replacement disk drive order date, which is a predetermined time in advance of said spare disk drive exhaustion date, which data is indicative of an identity of said disk memory system and a number of said spare disk drives presently utilized by said step of connecting.

9. The method of claim 8 wherein said step of computing comprises:
  storing data indicative of a repair time interval required by a repairperson to replace failed disk drives; and
  determining said replacement disk drive order date by decrementing said date spare disk drive exhaustion by said repair time interval.

10. The method of claim 9 wherein said disk memory system includes a real time clock signal, said step of computing further comprises:
  activating said step of transmitting when said real time clock signal matches said replacement disk drive order date.

11. The method of claim 7 further comprising the steps of:
  reconstructing said stream of data records written on said identified failed disk drive, using said associated redundancy data; and
  writing said reconstructed stream of data records on to said one connected spare disk drive.

12. The method of claim 11 wherein said step of reconstructing comprises the step of:
  generating said stream of data records written on said identified failed disk drive using said associated redundancy, data and the data records written on all of said at least two disk drives in said redundancy group except said identified failed disk drive.

13. In a disk memory system which stores data records that are accessible by at least one host processor using a plurality of disk drives for storing data thereon, a number of said disk drives being configured into at least two redundancy groups, each said redundancy group including n+m of said plurality of disk drives, where n and m are both positive integers with n greater than 1 and m at least equal to 1, said disk memory system including means for storing each stream of data records received from said host processor on successive ones of said n disk drives in a selected redundancy group and means responsive to said storing means storing streams of data records on all n disk drives in said selected redundancy group for generating m segments of data redundancy information for said data records stored on said n disk drives and means for writing said m segments of redundancy data on to said m disk drives of said selected redundancy group, an automated disk drive replacement scheduling system comprising:
  means for identifying a plurality of said disk drives as spare disk drives, which spare disk drives are shared in common by said at least two redundancy groups;
  means for identifying at least one of said disk drives in one of said at least two redundancy groups that fails to function;
  means for connecting one of said spare disk drives in place of said identified failed disk drive;
  means, responsive to said identifying means, for storing failure data indicative of a time of failure of said identified failed disk drive; and
  means for computing from said stored failure data a replacement disk drive order date indicative of a date a predetermined time in advance of a spare disk drive exhaustion date indicative of when said connecting means is likely to utilize a last of said identified spare disk drives.

14. The system of claim 13 further comprising:
means, responsive to said computing means, for transmitting data to a maintenance facility, on said replacement disk drive order date, which data is indicative of an identity of said disk memory system and a number of said spare disk drives presently utilized by said connecting means.

15. The system of claim 14 wherein said computing means comprises:
means for storing data indicative of a repair time interval required by a repairperson to replace failed disk drives; and
means for determining said replacement disk drive order date by decrementing said spare disk drive exhaustion date by said repair time interval.

16. The system of claim 15 wherein said disk memory system includes a real time clock signal, said computing means further comprises:
means for activating said transmitting means when said real time clock signal matches said replacement disk drive order date.

17. The system of claim 13 further comprising:
means for reconstructing said stream of data records written on said identified failed disk drive, using said associated redundancy data; and
means for writing said reconstructed stream of data records on to said one connected spare disk drive.

18. The system of claim 17 wherein said reconstructing means includes:
means for generating said stream of data records written on said identified failed disk drive using said associated redundancy data and the data records written on all said at least two disk drives in said redundancy group except said identified failed disk drive.

19. In a disk memory system which stores data records that are accessible by at least one host processor using a plurality of disk drives for storing data thereon, a number of said disk drives being configured into at least two redundancy groups, each said redundancy group including n+m of said plurality of disk drives, where n and m are both positive integers with n greater than 1 and m at least equal to 1, said disk memory system storing each stream of data records received from said host processor on successive ones of said n disk drives in a selected redundancy group and responsive to storing streams of data records on all n disk drives in said selected redundancy group for generating m segments of data redundancy information for said data records stored on said n disk drives and for writing said m segments of redundancy data on to said m disk drives of said selected redundancy group, a method of automatically scheduling the replacement of disk drives comprising the steps of:
identifying a plurality of said disk drives as spare disk drives, which spare disk drives are shared in common by said at least two redundancy groups;
identifying one of said disk drives in one of said at least two redundancy groups that fails to function;
connecting one of said identified spare disk drives in place of said identified failed disk drive;
storing failure data, in response to said step of identifying, indicative of a time of failure of said identified failed disk drive; and
computing from said stored failure data a replacement disk drive order date indicative of a date a predetermined time in advance of a spare disk drive exhaustion date indicative of when said step of connecting is likely to utilize a last of said identified spare disk drives.

20. The method of claim 19 further comprising the step of:
transmitting data to a maintenance facility, on a replacement disk drive order date which is a predetermined time in advance of said spare disk drive exhaustion date, which data is indicative of an identity of said disk memory system and a number of said identified spare disk drives presently utilized by said step of connecting.

21. The method of claim 20 wherein said step of computing comprises:
storing data indicative of a repair time interval required by a repairperson to replace failed disk drives; and
determining said replacement disk drive order date by decrementing said spare disk drive exhaustion date by said repair time interval.

22. The method of claim 21 wherein said disk memory system includes a real time clock signal, said step of computing further comprises:
activating said step of-transmitting when said real time clock signal matches said replacement disk drive order date.

23. The method of claim 19 further comprising the steps of:
reconstructing said stream of data records written on said identified failed disk drive, using said associated redundancy data; and
writing said reconstructed stream of data records on to said one connected spare disk drive.

24. The method of claim 23 wherein said step of reconstructing comprises:
generating said stream of data records written on said identified failed disk drive using said associated redundancy data and data records written on all said at least two disk drives in said redundancy group except said identified failed disk drive.

* * * * *